United States Patent [19]

Funada

[11] Patent Number: 5,113,155

[45] Date of Patent: May 12, 1992

[54] OSCILLATOR EMPLOYING A STRIP LINE OF TRI-PLATE STRUCTURE AS A RESONANT ELEMENT

[75] Inventor: Yo Funada, Kyoto, Japan

[73] Assignee: Murata Manufacturing Co., Ltd., Kyoto, Japan

[21] Appl. No.: 744,582

[22] Filed: Aug. 13, 1991

[30] Foreign Application Priority Data

Aug. 15, 1990 [JP] Japan .................. 2-216425

[51] Int. Cl.$^5$ ............................. H05B 7/00
[52] U.S. Cl. ............................. 331/107 SL
[58] Field of Search ............ 331/96, 101, 107 R, 331/107 SL; 333/222, 238, 246

[56] References Cited

U.S. PATENT DOCUMENTS

| | | | |
|---|---|---|---|
| 3,639,857 | 2/1972 | Okoshi et al. | 333/238 X |
| 4,394,633 | 8/1983 | Klein | 333/238 |
| 4,639,691 | 1/1987 | Iigima | 331/107 SL X |

Primary Examiner—Robert J. Pascal
Attorney, Agent, or Firm—Wegner, Cantor, Mueller & Player

[57] ABSTRACT

An oscillator employing a strip line of tri-plate structure as a resonant element comprising a substrate having a strip line electrode embedded therein and a pair of grounding electrodes opposed to each other with the strip line electrode therebetween, neither of the pair of grounding electrodes being exposed on an upper main surface of the substrate, an oscillation circuit portion provided on the upper main surface of the substrate, a capacitor electrode provided on the upper main surface of the substrate, the capacitor electrode being opposed to the embedded grounding electrode, wherein one end of the strip line electrode is connected to the capacitor electrode and the oscillation circuit portion through a first connecting electrode extending from the above one end of the strip line electrode to the upper main surface of the substrate and wherein the other end of the strip line electrode is connected to at least one of the pair of grounding electrodes through a second connecting electrode.

8 Claims, 3 Drawing Sheets

OSCILLATOR EMPLOYING A STRIP LINE OF TRI-PLATE STRUCTURE AS A RESONANT ELEMENT

BACKGROUND OF THE INVENTION

1) Field of the Invention

The present invention relates to an oscillator employing a strip line of tri-plate structure as a resonant element.

2) Description of the Prior Art

FIG. 1 is an equivalent circuit diagram of a Colpitts oscillator. This type of oscillator is generally used in a mobile communication device.

In FIG. 1, capacitors C1 and C2 and a resonant element L constitute a positive feedback circuit for a transistor TR.

A strip line of tri-plate structure is often used as the resonant element L in the above Colpitts oscillator. The strip line of tri-plate structure comprises a substrate having a pair of grounding electrodes and a strip line electrode disposed between the pair of grounding electrodes. The strip line electrode acts as a resonant coil and resonant capacitors are formed between the strip line electrode and the grounding electrodes.

An oscillation frequency of the above oscillator is determined by a length of the strip line electrode in terms of design. However, the oscillation frequency is also influenced by other factors such as dispersion of the capacitances of the capacitors C1 and C2. Therefore, it has been mostly desired to eliminate or at least reduce such dispersion of the oscillation frequency due to the dispersion of the capacitances in the manufacturing process of the oscillator.

Generally, if capacitors having less dispersion of capacitances are employed, the dispersion of the oscillation frequency can be prevented. However, such capacitors cost too much and therefore, are not suitable for an oscillator which is compact, light and inexpensive. It is also conceivable to connect a variable capacitor in parallel with the resonant element L and vary the capacitance of the variable capacitor, thereby adjusting the oscillation frequency. In this case, although the costs of the capacitors C1 and C2 are not increased, the variable capacitor itself is expensive. Therefore, this also is not suitable for the above oscillator.

SUMMARY OF THE INVENTION

The present invention, therefore, has an object of providing an oscillator capable of easily adjusting an oscillation frequency without increasing a manufacturing cost.

The above object is fulfilled by an oscillator employing a strip line of tri-plate structure as a resonant element comprising a substrate having a strip line electrode embedded therein and a pair of grounding electrodes opposed to each other with the strip line electrode therebetween, neither of the pair of grounding electrodes being exposed on an upper main surface of the substrate; an oscillation circuit portion provided on the upper main surface of the substrate; and a capacitor electrode provided on the upper main surface of the substrate, the capacitor electrode being opposed to the embedded grounding electrode; wherein one end of the strip line electrode is connected to the capacitor electrode and the oscillation circuit portion through a first connecting electrode extending from the above one end of the strip line electrode to the upper main surface of the substrate and wherein the other end of the strip line electrode is connected to at least one of the pair of grounding electrodes through a second connecting electrode.

The first connecting electrode may be formed by coating an inner surface of a through hole extending from the upper main surface of the substrate to the one above end of the strip line electrode with a conductive material and the second connecting electrode may be formed by coating an inner surface of a through hole extending from one grounding electrode to the other grounding electrode across the other end of the strip line electrode with a conductive material.

The grounding electrode opposed to the capacitor electrode may have a cutout in a portion corresponding to the first through hole so that the above grounding electrode is kept out of contact with the conductive material coated on the inner surface of the first through hole.

The other of the pair of grounding electrodes may be exposed on a bottom main surface of the substrate.

The oscillation circuit portion may have an active element, both ends of the strip line electrode being connected to the oscillation circuit portion to effect a positive feedback, wherein a capacitor formed by the capacitor electrode and the grounding electrode opposed thereto is connected in parallel with the strip line electrode, and wherein an oscillation frequency of the oscillator is adjusted by trimming the capacitor electrode.

The oscillation circuit portion and the strip line electrode may constitute a Colpitts oscillation circuit.

According to the above construction, the capacitor electrode is formed on one main surface of the substrate so that it is opposed to the grounding electrode and the above capacitor electrode is electrically connected with one end of the strip line electrode through the connecting electrode. Therefore, the oscillation frequency of the oscillator can be adjusted by appropriately trimming the capacitor electrode. That is, the oscillation frequency can easily be adjusted only by providing the capacitor electrode on the substrate and without employing expensive capacitors.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings..

DESCRIPTION OF THE PREFERRED EMBODIMENT

Figure 1:
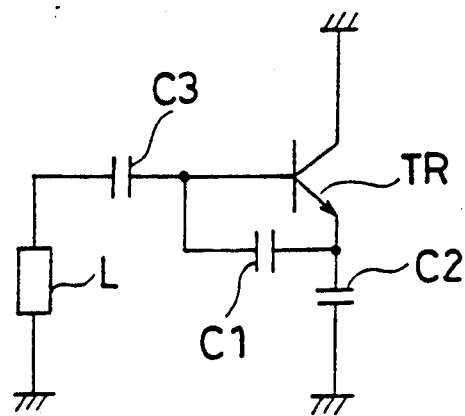
FIG. 1 is an electrical equivalent circuit diagram of a Colpitts oscillator.

An embodiment of the present invention will be described in detail hereinafter, referring to the drawings.

Figure 2:
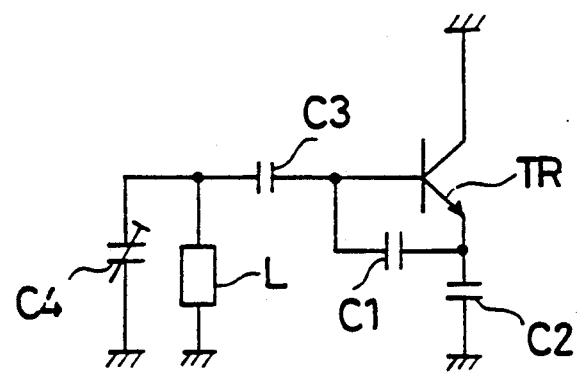
FIG. 2 is an electrical equivalent circuit diagram of an oscillator according to an embodiment of the present invention.
Figure 3:
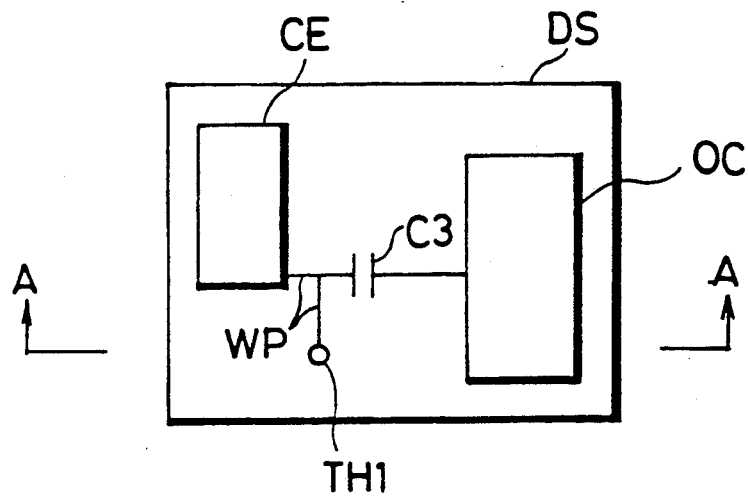
FIG. 3 is a plan view showing a mechanical construction of the above oscillator.
Figure 4:
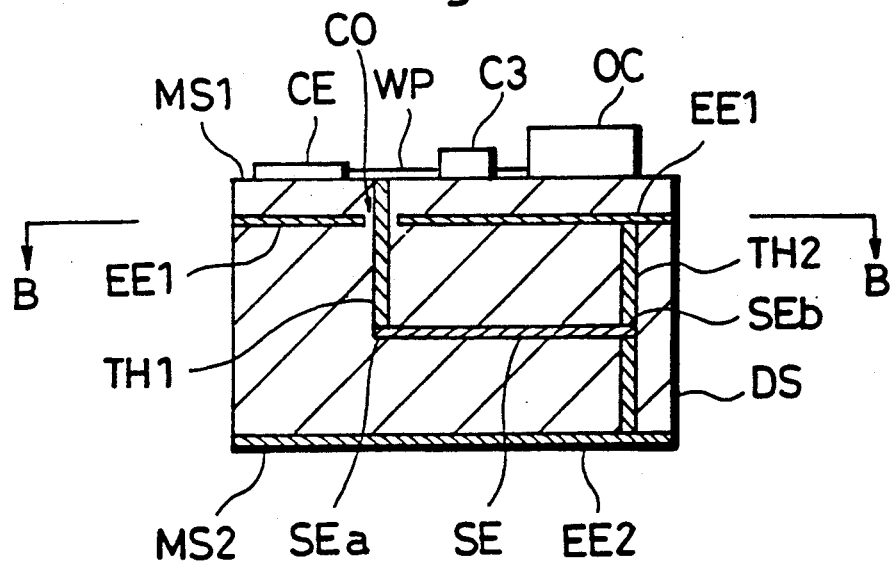
FIG. 4 is a sectional view taken along the line A—A of FIG. 3.

An oscillator according to the present invention has an electrical circuit construction as shown in FIG. 2 wherein an oscillation frequency adjusting capacitor C4 is connected in parallel with a resonant element L. FIGS. 3 and 4 show the mechanical construction of the above oscillator.

The oscillator comprises a dielectric substrate DS, a first grounding electrode EE1, a second grounding electrode EE2 and a strip line electrode SE disposed between the first and second grounding electrodes EE1 and EE2. The first grounding electrode EE1 is embedded in the dielectric substrate DS at an appropriate distance from one main surface MS1 of the dielectric substrate DS, while the second grounding electrode EE2 is exposed on the other main surface MS2 of the dielectric substrate DS. Each of the grounding electrodes EE1 and EE2 has substantially the same surface area as that of the surface MS1 or MS2 of the dielectric substrate DS. Further, the strip line electrode SE is positioned substantially midway between the grounding electrodes EE1 and EE2.

On the surface MS1, are provided a capacitor electrode CE, a wiring pattern WP, a DC cut capacitor C3 and an oscillation circuit portion OC. The oscillation circuit portion OC includes a transistor TR and capacitors C1 and C2 in FIG. 2.

The dielectric substrate DS has a first through hole TH1 extending from the surface MS1 to one end SEa of the strip line electrode SE. The inner surface of the through hole TH1 is coated with a conductive material, whereby the end SEa, the DC cut capacitor C3 and the oscillation circuit portion OC are electrically connected with one another via the first through hole TH1 and the wiring pattern WP.

Further, the dielectric substrate DS has a second through hole TH2 extending from the first grounding electrode EE1 to the second grounding electrode EE2 across the other end SEb of the strip line electrode SE. The inner surface of the through hole TH2 is also coated with a conductive material, whereby the end SEb, the grounding electrodes EE1 and EE2 are electrically connected with one another via the second through hole TH2.

The capacitor electrode CE is provided so that it is opposed to the first grounding electrode EE1. The first grounding electrode EE1 and the capacitor electrode CE respectively act as opposed electrodes of the capacitor C4 in FIG. 2. Since the capacitor electrode CE is electrically connected with the end SEa via the first through hole TH1 as described above, the capacitance of the capacitor C4 in FIG. 2 is obtained between the capacitor electrode CE and first grounding electrode EE1.

Figure 5:
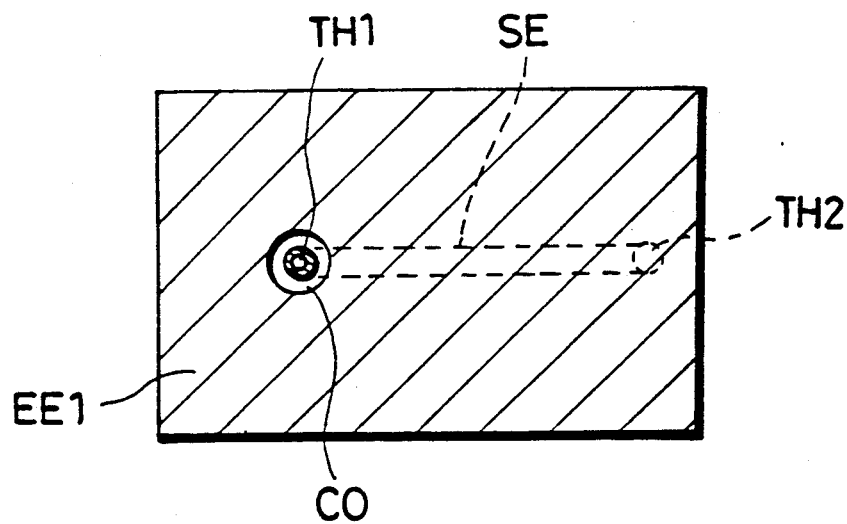
FIG. 5 is a sectional view taken along the line B—B of FIG. 4.

In addition, as shown in FIG. 5, the first grounding electrode EE1 has a cutout CO in a portion corresponding to the first through hole TH1. Thus, the first grounding electrode EE1 is prevented from being contacted with the conductive material of the first through hole TH1.

In the above construction, the oscillation frequency can be adjusted by trimming the capacitor electrode CE, thereby adjusting the capacitance of the capacitor C4 in FIG. 2.

Although the present invention has been fully described by way of an embodiment with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An oscillator employing a strip line of tri-plate structure as a resonant element comprising:
    a substrate having a strip line electrode embedded therein and a pair of grounding electrodes opposed to each other with the strip line electrode therebetween, neither of the pair of grounding electrodes being exposed on an upper main surface of said substrate;
    an oscillation circuit portion provided on the upper main surface of said substrate; and
    a capacitor electrode provided on the upper main surface of said substrate, said capacitor electrode being opposed to the embedded grounding electrode;
    wherein one end of the strip line electrode is connected to said capacitor electrode and said oscillation circuit portion through a first connecting electrode extending from the above one end of the strip line electrode to the upper main surface of said substrate and wherein the other end of the strip line electrode is connected to at least one of the pair of grounding electrodes through a second connecting electrode.

2. An oscillator as claimed in claim 1, wherein the first connecting electrode is formed by coating an inner surface of a through hole extending from the upper main surface of said substrate to the above one end of the strip line electrode with a conductive material and the second connecting electrode is formed by coating an inner surface of a through hole extending from one grounding electrode to the other grounding electrode across the other end of the strip line electrode with a conductive material.

3. An oscillator as claimed in claim 2, wherein the grounding electrode opposed to said capacitor electrode has a cutout in a portion corresponding to the first through hole so that the above grounding electrode is kept out of contact with the conductive material coated on the inner surface of the first through hole.

4. An oscillator as claimed in claim 3, wherein the other of the pair of grounding electrodes is exposed on a bottom main surface of said substrate.

5. An oscillator as claimed in claim 4, wherein said oscillation circuit portion has an active element, both ends of the strip line electrode being connected to said oscillation circuit portion to effect a positive feedback, wherein a capacitor formed by said capacitor electrode and the grounding electrode opposed thereto is connected in parallel with the strip line electrode, and wherein an oscillation frequency of said oscillator is adjusted by trimming said capacitor electrode.

6. An oscillator as claimed in claim 5, wherein said oscillation circuit portion and the strip line electrode constitute a Colpitts oscillation circuit.

7. An oscillator employing a strip line of tri-plate structure as a resonant element comprising:
    a substrate having a first grounding electrode formed therein at a predetermined distance from a first main surface thereof, a second grounding electrode formed on a second main surface thereof and a strip line electrode formed therein so that it is positioned substantially midway between the first and second grounding electrodes;

an oscillation circuit portion provided on the first main surface of said substrate, the strip line electrode being connected to a positive feedback circuit of said oscillation circuit portion; and a capacitor electrode formed on the first main surface of said substrate so that it is opposed to the first grounding electrode, whereby a capacitor is formed therebetween, the capacitor being connected in parallel with the strip line electrode;

wherein said substrate has a first through hole extending from the first main surface to one end of the strip line electrode, an inner surface of the first through hole being coated with a conductive material, whereby the one end of the strip line electrode is connected to said oscillation circuit portion and said capacitor electrode via the first through hole, and a second through hole extending from the first grounding electrode to the second grounding electrode across the other end of the strip line electrode, an inner surface of the second through hole being coated with a conductive material and wherein an oscillation frequency of said oscillator is adjusted by trimming said capacitor electrode.

8. An oscillator as claimed in claim 7, wherein each of the first and second grounding electrodes has substantially the same surface area as a surface area of said substrate and wherein the first grounding electrode has a cutout in a portion corresponding to the first through hole so that the first grounding electrode is kept out of contact with the conductive material coated on the inner surface of the first through hole.

* * * * *